(12) United States Patent
Chen et al.

(10) Patent No.: US 6,726,554 B1
(45) Date of Patent: Apr. 27, 2004

(54) GUIDE RING REMOVAL DEVICE

(75) Inventors: Chih-Kun Chen, Taoyuan (TW); Shan Chang Wang, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/460,446

(22) Filed: Jun. 12, 2003

(30) Foreign Application Priority Data

Nov. 11, 2002 (TW) ...................................... 91218058 U

(51) Int. Cl.$^7$ ............................................... B24B 47/02
(52) U.S. Cl. ..................... 451/397; 451/364; 451/365; 451/452; 451/457; 451/914
(58) Field of Search ................. 451/364, 365, 451/397, 452, 457, 914

(56) References Cited

U.S. PATENT DOCUMENTS 6,206,768 B1 * 3/2001 Quek ........................ 451/398

\* cited by examiner

*Primary Examiner*—Joseph J. Hail, III
*Assistant Examiner*—Shantese McDonald
(74) *Attorney, Agent, or Firm*—Quintero Law Office

(57) ABSTRACT

A guide ring removal device. The guide ring removal device includes a column press, a first disc, a second disc, and a plurality of fasteners. The first disc is disposed on the column press. The second disc is disposed on a point of the column press to exert force on a carrier. The plurality of fasteners is disposed on the first disc, the fasteners grasping the guide ring. As the second disc exerts the primary force on the carrier, the fasteners generate reciprocal force on the guide ring, thus separating the guide ring. Engagement of the column press alters the distance between the first disc and the second disc, and the primary force is exerted on the carrier.

6 Claims, 5 Drawing Sheets

GUIDE RING REMOVAL DEVICE

BACKGROUND OF THE INVENTION

1. Field of the Invention

The present invention relates to a guide ring removal device, and more especially to device enabling safer and more convenient guide ring removal.

2. Description of the Related Art

In chemical mechanical process (CMP), a carrier holds and moves a wafer. As shown in FIG. 1, the carrier 100 comprises a cover ring 108, a barrier 106, a holding ring 104, a guide ring 102, a backing film 101, and shims 103, 105, 107.

The cover ring 108, the barrier 106 and the holding ring 104 constitute a pressure chamber. As the carrier 100 holds the wafer, the pressure in the chamber decreases to affix the wafer to the surface of the backing film 101. As a pad polishes the wafer, the pressure chamber imposes back pressure on the wafer to contact the wafer with the pad and improve the wafer polishing effect.

As the pressure chamber imposes the back pressure on the wafer, the guide ring 102 prevents the wafer from slipping. As shown in FIG. 2, as the carrier 100 holding the wafer 150, the guide ring 102 fixes the wafer 150 and keeps it from slipping. In addition, as shown in FIG. 3a, during polishing, the pad 160, under the weight of the carrier, bulges upward around the periphery of the wafer. Without the guide ring 102, this bulging promotes over-polishing on an edge portion 155 of the wafer 150. As shown in FIG. 3b, the guide ring 102 is provided, spreading the polishing surface, to prevent the edge portion 155 of the wafer 150 from excess contact with the pad, thereby avoiding over-polishing of the wafer.

In carrier maintenance, the guide ring 102 must be separated from the carrier 100. However, the slurry and the chemicals used in polishing and particles generated thereby can adhere the guide ring 102 to the carrier 100, making separation of the guide ring 102 difficult. Conventionally, the guide ring 102 is separated by prying, requiring undue time and effort, possible damage to the guide ring 102 and the carrier 100, and presenting possible safety risks.

SUMMARY OF THE INVENTION

For these reasons, there is a clear need for a device enabling safer and more convenient guide ring removal.

The present invention includes a column press, a first disc, a second disc, and a plurality of fasteners. The first disc is disposed on the column press. The second disc is disposed on a point of the column press to exert force on a carrier. The plurality of fasteners is disposed on the first disc, grasping the guide ring. As the second disc exerts the primary force on the carrier, the fasteners generate reciprocal force on the guide ring, thus separating the guide ring. Engagement of the column press alters the distance between the first disc and the second disc, and the primary force is exerted on the carrier.

With the present invention, guide ring separation is rendered easier and safer, and damage to the guide ring is avoided.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
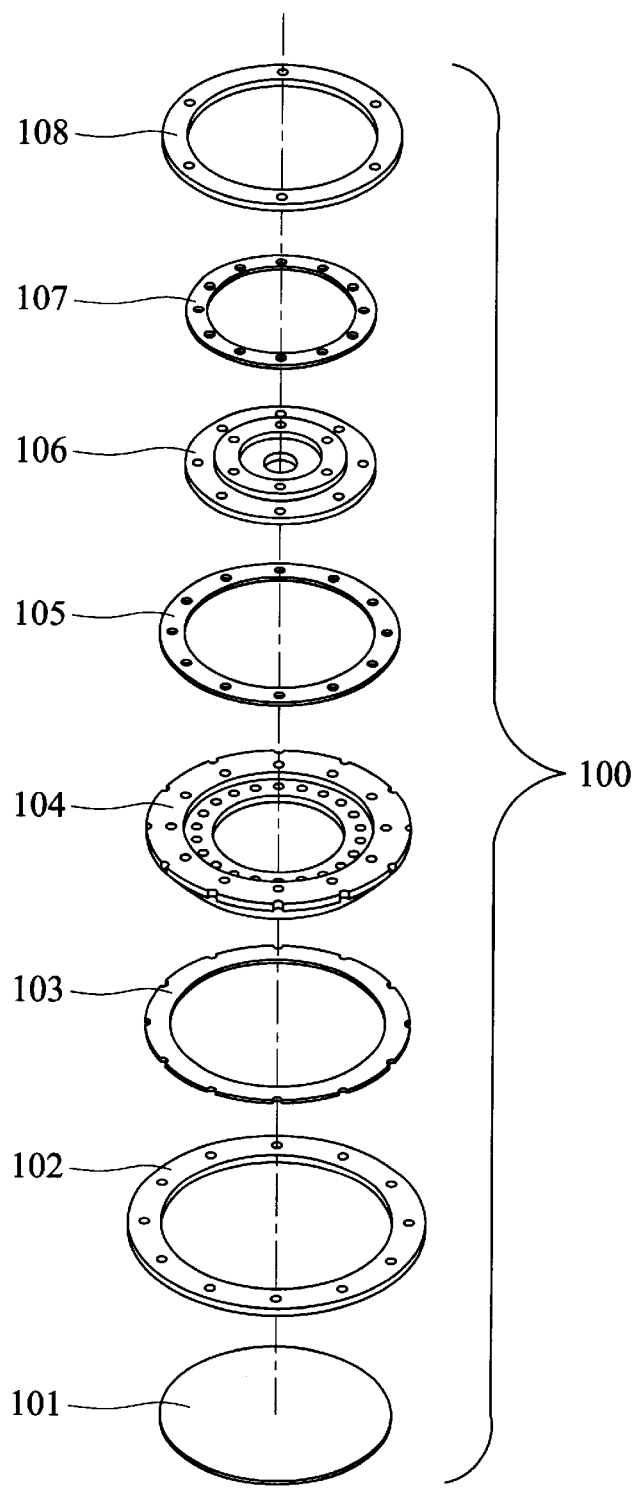
FIG. 1 is an exploded perspective diagram of a carrier.
Figure 2:
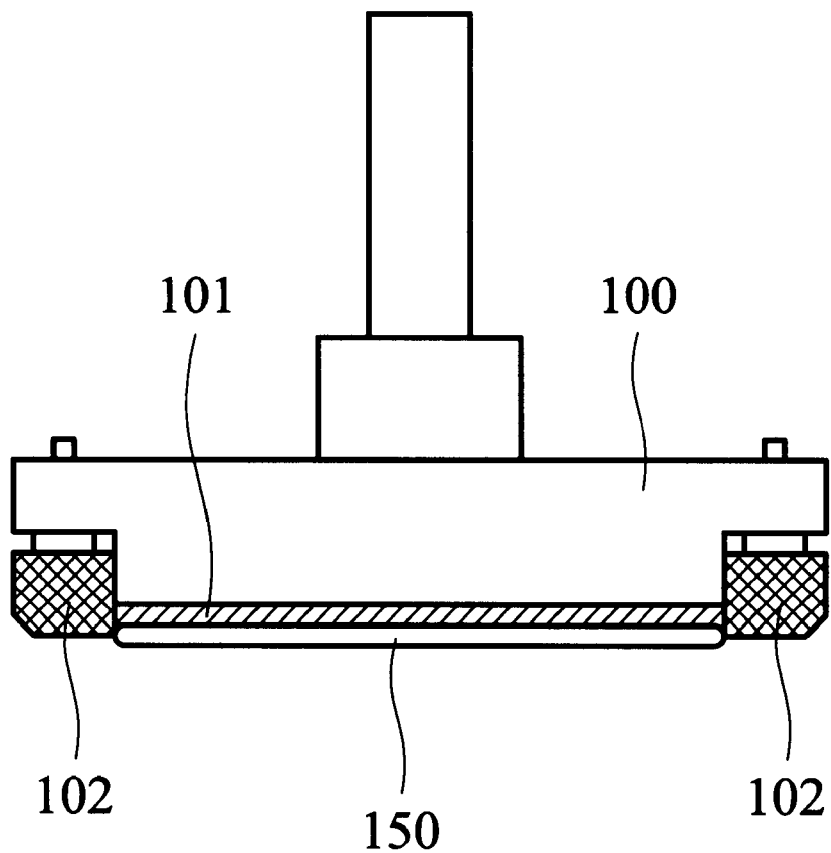
FIG. 2 shows a guide ring maintaining the position of a wafer.
Figure 3A:
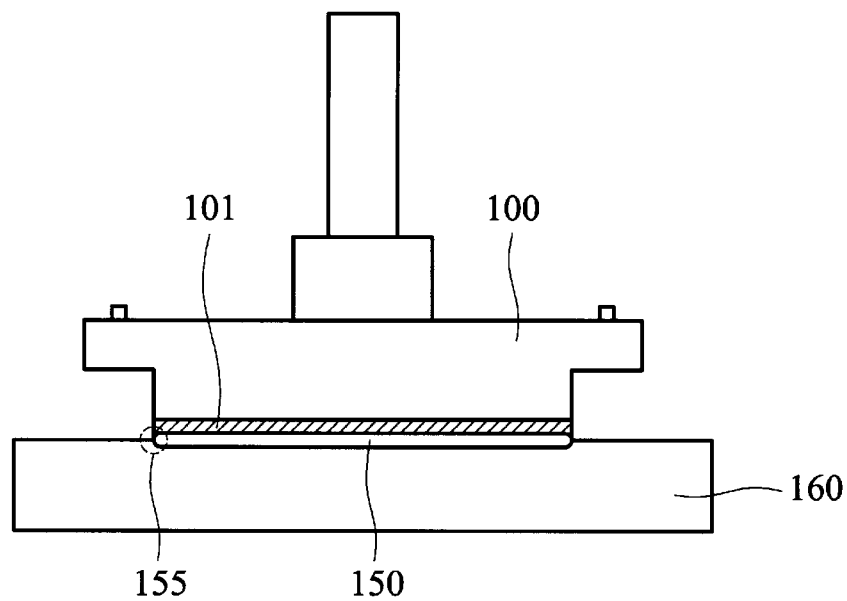
FIG. 3a shows the edge of the wafer undergoing over polishing in the absence of a guide ring on the carrier.
Figure 3B:
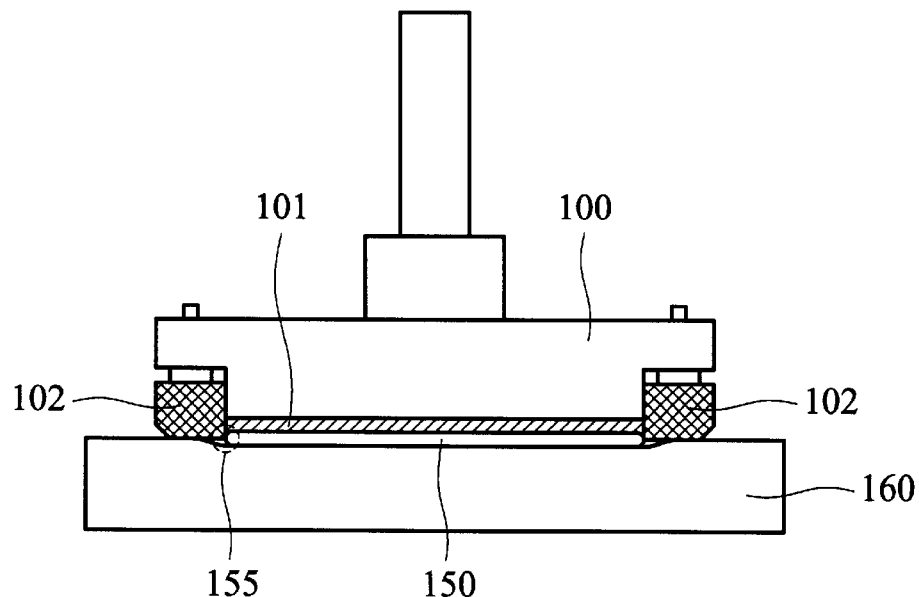
FIG. 3b shows the over-polishing situation being corrected after providing the guide ring on the carrier.
Figure 4:
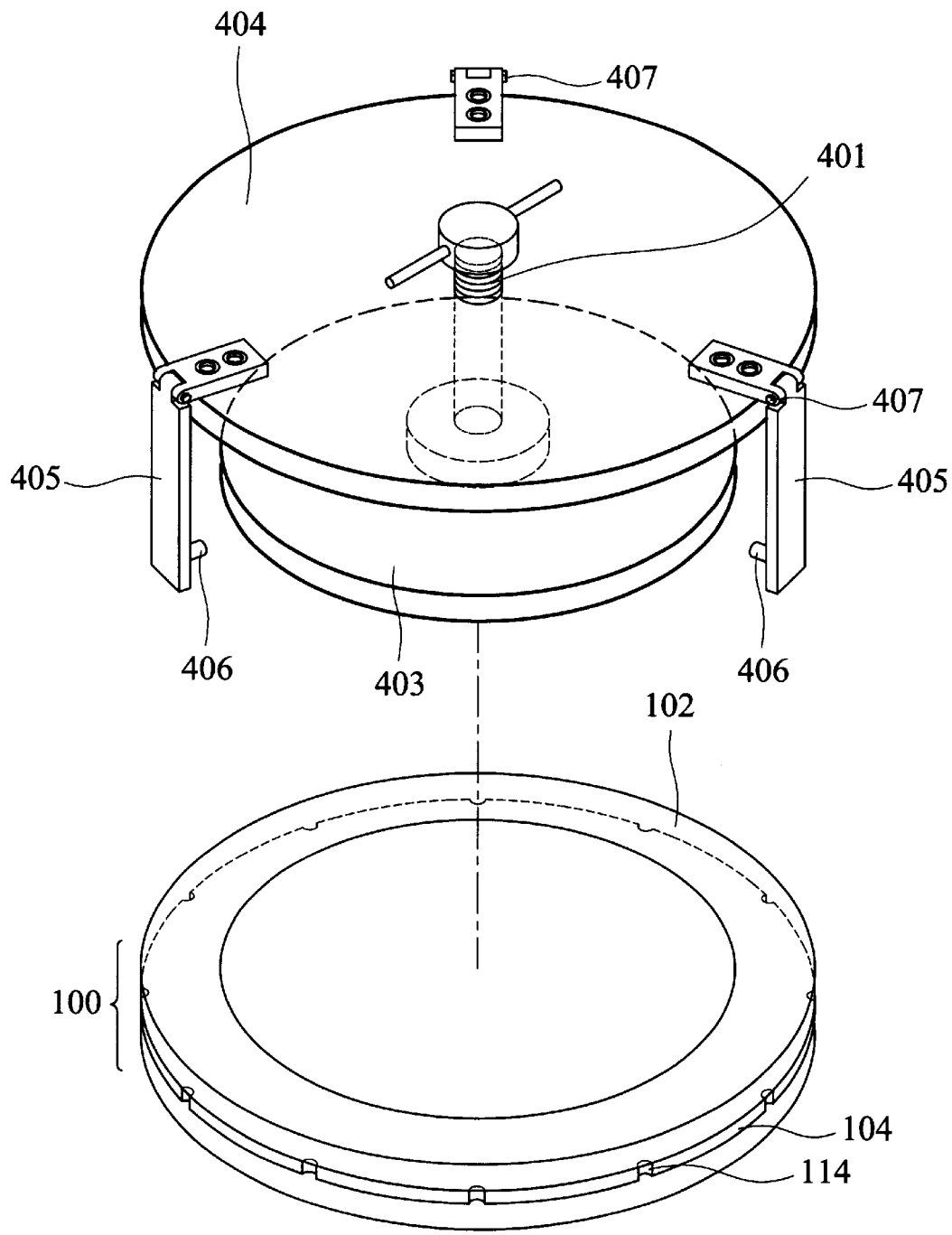
FIG. 4 shows the structure of the present invention.

FIG. 4 shows an embodiment of the present invention. The present invention includes a column press (e.g., a threaded column press) 401, a first disc 404, a second disc 403 and a plurality of fasteners 405. The first disc 404 is disposed on the column press 401. The second disc 403 is disposed on a point of the column press 401 to exert force on a carrier 100. The plurality of fasteners 405 are disposed on the first disc 404, the fasteners 405 grasping the guide ring 102. As the second disc 403 exerts the primary force on the carrier 100, the fasteners 405 generate reciprocal force on the guide ring 102, and separate the guide ring 102 through the reciprocal force.

Engagement of the column press 401 changes the distance between the first disc 404 and the second disc 403 such that primary force is exerted on the carrier 100.

Each of the fasteners 405 is rectangular and disposed on the first disc by a corresponding bolt 407, and can be rotated therearound. The bolt 407 maintains the fasteners 405's neutral equilibrium.

Figure 5:
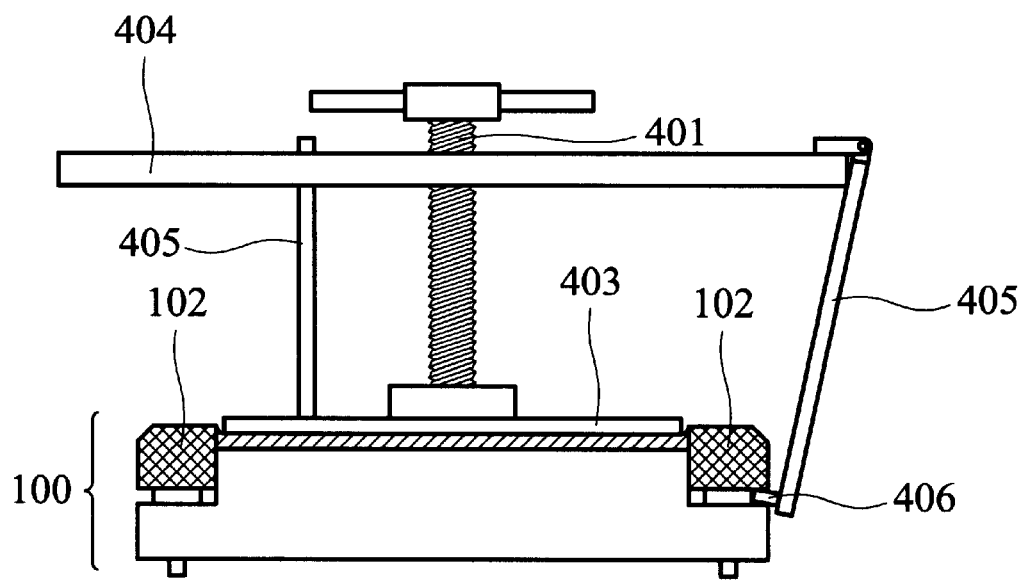
FIG. 5 shows the operating condition of the present invention.

There are three fasteners 405, uniformly distributed around the edge of the first disc 404. Each of the fasteners 405 has a hook 406. During operation, the hook 406 is disposed in a trench 114. As shown in FIG. 5, the hook 406 grasps the edge of the guide ring 102. As the second disc 403 applies force on the carrier 100, the hooks 406 exert reciprocal force on the guide ring 102 and separate the guide ring 102.

The present invention applies uniform reciprocal force around the circumference of the guide ring 102, such that, during removal, the guide ring 102 will not tilt and jam on the carrier. As well, the present invention provides relatively stronger reciprocal force to remove the guide ring 102, making separation easier and faster. Finally, guide ring removal according to the present invention can be accomplished by a single operator.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A guide ring removal device, comprising:

a column press;

a first disc, disposed on the column press;

a second device, disposed on a point of the column press to exert force on a carrier; and plural fasteners, disposed on the first disc, the fasteners grasping the guide ring, the fasteners generating reciprocal force on the guide ring as the second disc exerts a primary force on the carrier, and separating the guide ring through the reciprocal force;

wherein engagement of the column press alters the distance between the first disc and the second disc, and the primary force is exerted on the carrier.

2. The guide ring removal device of claim 1, wherein each of the fasteners is disposed on the first disc by a corresponding bolt, the bolt maintaining the fastener's neutral equilibrium.

3. The guide ring removal device of claim 1, wherein each of the fasteners has a corresponding hook, the hook grasping the guide ring when the guide ring removal device is engaged.

4. The guide ring removal device of claim 1, wherein the fastener is rectangular.

5. The guide ring removal device of claim 1, wherein the fasteners are uniformly distributed around an edge of the first disc.

6. The guide ring removal device of claim 1, wherein the column press is a threaded column press.

* * * * *